(12) United States Patent
Han et al.

(10) Patent No.: US 8,208,308 B2
(45) Date of Patent: Jun. 26, 2012

(54) METHOD OF PROGRAMMING NONVOLATILE MEMORY DEVICE

(75) Inventors: Jung Chul Han, Gyeonggi-do (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 203 days.

(21) Appl. No.: 12/796,209

(22) Filed: Jun. 8, 2010

(65) Prior Publication Data

US 2010/0329020 A1 Dec. 30, 2010

(30) Foreign Application Priority Data

Jun. 29, 2009 (KR) .................. 10-2009-0058488

(51) Int. Cl.
*G11C 16/04* (2006.01)
(52) U.S. Cl. .......... 365/185.19; 365/185.22; 365/185.25
(58) Field of Classification Search ............. 365/185.19, 365/185.22, 185.25
See application file for complete search history.

(56) References Cited

U.S. PATENT DOCUMENTS

| | | | | |
|---|---|---|---|---|
| 7,701,775 B2 * | 4/2010 | Kang | ................. | 365/185.21 |
| 7,933,150 B2 * | 4/2011 | Im | ................. | 365/185.03 |
| 8,054,685 B2 * | 11/2011 | Lim | ................. | 365/185.03 |
| 8,085,602 B2 * | 12/2011 | Yang et al. | ................. | 365/189.05 |
| 8,107,287 B2 * | 1/2012 | Jung | ................. | 365/185.03 |

FOREIGN PATENT DOCUMENTS

| | | |
|---|---|---|
| KR | 1020080007568 | 1/2008 |
| KR | 1020080062704 | 7/2008 |
| KR | 1020090048130 | 5/2009 |

OTHER PUBLICATIONS

Notice of Allowance issued from Korean Intellectual Property Office on Jun. 27, 2011.

\* cited by examiner

*Primary Examiner* — Pho M Luu
(74) *Attorney, Agent, or Firm* — IP & T Group LLP

(57) ABSTRACT

A method of programming a nonvolatile memory device includes an initial data setting step of inputting data for program inhibition to a first latch of a page buffer to which memory cells to be programmed with a second threshold voltage distribution are coupled, a first program and verification step of performing program and verification operations, a first data setting step of, when a program pulse is supplied more than N times (where N is a natural number), inputting data for performing a program operation to the first latch of the page buffer to which the memory cells to be programmed with the second threshold voltage distribution are coupled, and a second program and verification step of performing program and verification operations.

25 Claims, 10 Drawing Sheets

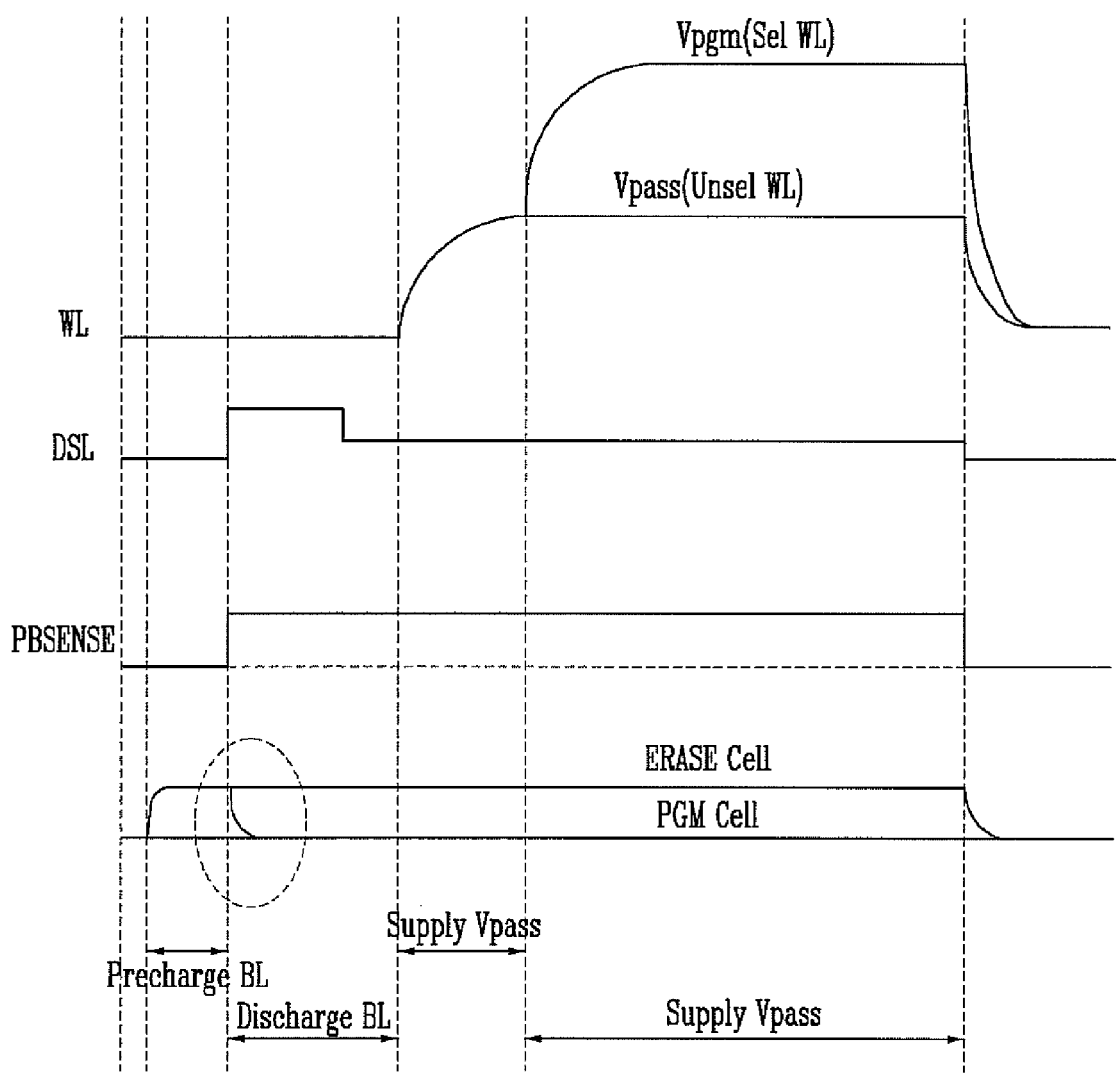

METHOD OF PROGRAMMING NONVOLATILE MEMORY DEVICE

CROSS-REFERENCE TO RELATED APPLICATION

Priority to Korean patent application number 10-2009-0058488 filed on Jun. 29, 2009, the entire disclosure of which is incorporated by reference herein, is claimed.

BACKGROUND

Exemplary embodiments relate to a method of programming a nonvolatile memory device.

There has been an increasing demand for nonvolatile memory devices which can be electrically programmed and erased and can retain its data even without the supply of power. Further, high-capacity memory devices that are highly integrated and capable of storing a large amount of data are desired. Such a nonvolatile memory device may, for example, be a plurality of memory cells coupled in series together to form one cell string, where each memory cell array includes a plurality of the cell strings.

Each cell string of the nonvolatile memory device has a structure in which a plurality of memory cells are coupled between a bit line and a source line. Through such a string structure, the number of contacts between the bit line and the source line can be reduced and the size of the memory cell can be made small, thereby enabling high-capacity memory. Such a string structure, however, raises a concern in that the access speed is low because the cell current of a memory cell becomes smaller with a reduction in the size of the memory cell.

In a multi-level cell, unlike a typical memory device, one memory cell of the nonvolatile memory device can store 2 or more bits of data (i.e., a multi-level form). That is, the memory cell can store data of various states by having multiple distributions of threshold voltages by controlling the amount of charges trapped at the floating gate of the memory cell. Such a multi-level cell (MLC) program method is being widely used because it can significantly increase the memory capacity of the memory cell. In the multi-level cell (MLC) program method, data of two or more logical pages are programmed into one physical page. However, the time that it takes to perform a program operation is relatively long and a process of performing the program operation is relatively complicated, because data of several logical pages are programmed into one physical page. Furthermore, with an increase in the number of threshold voltage distributions, the width between the distributions of the threshold voltage is narrowed. Accordingly, the read margin is reduced, which raises a concern in reading data accurately.

BRIEF SUMMARY

Exemplary embodiments relate to a method of programming a nonvolatile memory device, which is capable of reducing current consumption occurring due to the discharge of a bit line during a program operation, the number of program verification operations, and a total program time by not supplying a program voltage until the program voltage rises up to a certain voltage level in a memory cell programmed with a high threshold voltage.

According to an aspect of the present disclosure, there is provided a method of programming a nonvolatile memory device so that memory cells have one of first and second threshold voltage distributions. The method comprises an initial data setting step of inputting data for program inhibition to a first latch of a page buffer to which memory cells to be programmed with the second threshold voltage distribution are coupled; a first program and verification step of performing program and verification operations; a first data setting step of, when a program pulse is supplied more than N times (where N is a natural number), inputting data for performing a program operation to the first latch of the page buffer to which the memory cells to be programmed with the second threshold voltage distribution are coupled; and a second program and verification step of performing program and verification operations.

According to another aspect of the present disclosure, there is provided a method of programming a nonvolatile memory device, where the nonvolatile memory device has memory cells and each memory cell has one of first to fourth threshold voltage distributions. The method comprises an initial data setting step of inputting data for program inhibition to a first latch of a page buffer to which memory cells to be programmed with the third and fourth threshold voltage distributions are coupled; a first program and verification step of performing program and verification operations; a first data setting step of, when a program pulse is supplied more than N times (where N is a natural number), inputting data for performing a program operation to the first latch of the page buffer to which the memory cells to be programmed with the third threshold voltage distribution are coupled; a second program and verification step of performing program and verification operations; a second data setting step of, when the program pulse is supplied more than M times (where M>N and M is a natural number), inputting data for performing a program operation to the first latch of the page buffer to which the memory cells to be programmed with the fourth threshold voltage distribution are coupled; and a third program and verification step of performing program and verification operations.

According to yet another aspect of the present disclosure, there is provided a method of programming a nonvolatile memory device, where the nonvolatile memory device has memory cells coupled to bit lines and word lines and further has page buffers that are each coupled to one or more of the bit lines. The method comprises an initial data setting step of inputting data to first to third latches of a selected page buffer of the page buffers so that selected memory cells of the memory cells are programmed to each have one of first to fourth threshold voltage distributions and changing the data of the first latch so that memory cells to be programmed with the third and fourth threshold voltage distributions are program-inhibited; a first program and verification step of performing program and verification operations in response to a state of the data of the first latch; a second program and verification step of, when a program pulse is supplied more than N times (where N is a natural number), setting first data to change the data of the first latch so that memory cells to be programmed with the third threshold voltage distribution can be programmed and performing program and verification operations in response to a state of the data of the first latch; and a third program and verification step of, when the program pulse is supplied more than M times (where M is a natural number greater than N), setting second data to change the data of the first latch so that memory cells to be programmed with the fourth threshold voltage distribution can be programmed and performing program and verification operations in response to a state of the data of the first latch.

According to further yet another aspect of the present disclosure, there is provided a method of programming a nonvolatile memory device, where erase cells are programmed to have one of N threshold voltage distributions and N is a natural number. The method comprises the step of setting a different program pulse for performing a program operation for every group of the memory cells to be programmed with the threshold voltage distributions, program-inhibiting the memory cells before a certain number of the program pulses are supplied, and performing the program operation when the certain number of program pulses is reached. In this case, a greater number of the program pulses are set for memory cells to be programmed with a higher threshold voltage distribution than a threshold voltage distribution used for the performed program operation.

BRIEF DESCRIPTION OF THE DRAWINGS

FIG. 3 is a timing diagram illustrating a program operation of the nonvolatile memory device according to an exemplary embodiment of the present disclosure;

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1A:
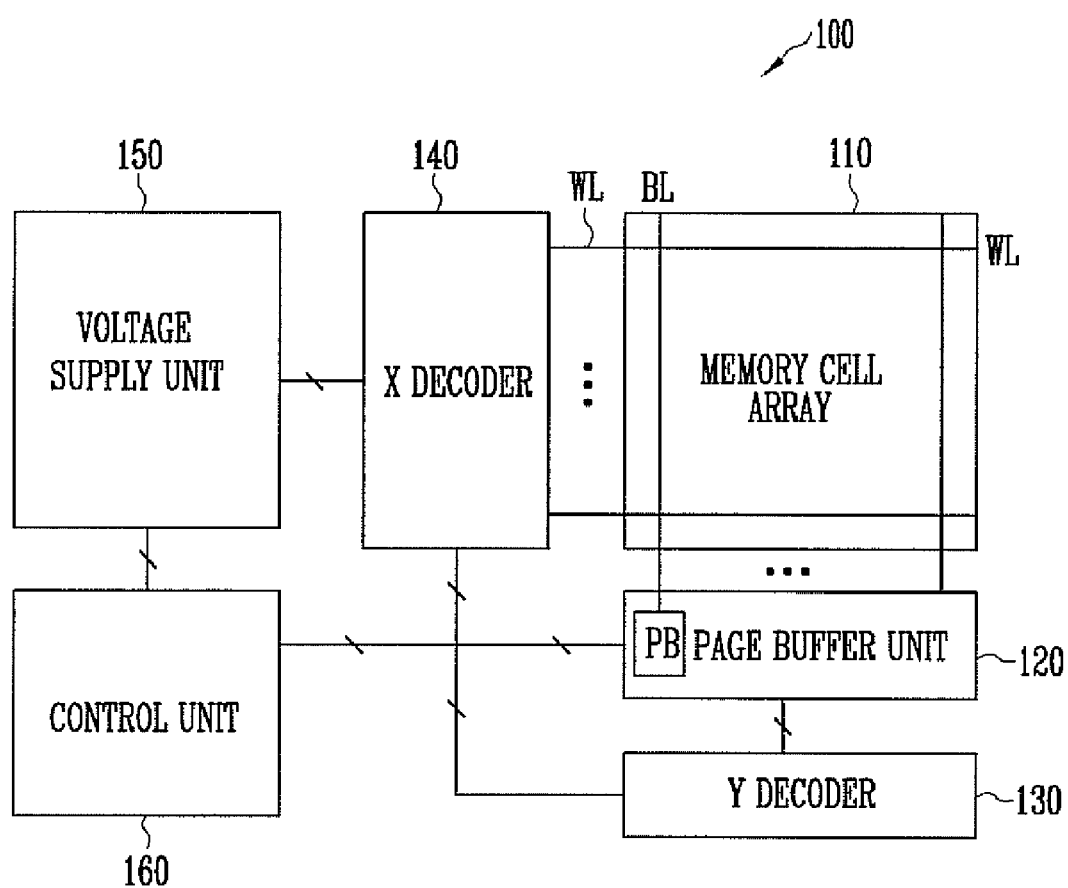
FIG. 1A shows a nonvolatile memory device according to an exemplary embodiment of the present disclosure.

FIG. 1A shows a nonvolatile memory device according to an exemplary embodiment of the present disclosure.

Referring to FIG. 1A, the nonvolatile memory device 100 includes a memory cell array 110, a page buffer unit 120, a Y decoder 130, an X decoder 140, a voltage supply unit 150, and a control unit 160.

The memory cell array 110 includes a plurality of memory blocks BK (not shown). Each of the memory blocks BK includes a plurality of memory cells coupled to bit lines BL and word lines WL. It is assumed that the memory cell of the nonvolatile memory device 100 according to the exemplary embodiment of the present disclosure is a multi-level cell (MLC) capable of storing 2 bits of data. However, use of multi-level cells that are each capable of storing more than 2 bits of data is also contemplated.

Each of the word lines corresponding to respective physical pages includes the logical pages of a least significant bit (LSB) page and a most significant bit (MSB) page.

The page buffer unit 120 includes page buffers PB each coupled to one or more bit lines BL. In an exemplary embodiment of the present disclosure as shown in FIG. 1A, one page buffer PB is coupled to a pair of the bit lines BL, including an even bit line BLe and an odd bit line BLo.

The page buffers PB are used for program and data read operations and configured to perform a program verification operation according to a latched data state.

The Y decoder 130 is used to enable a data input and output path to the page buffers PB in response to a control signal of the control unit 160.

The X decoder 140 is configured to select the word line in response to a control signal of the control unit 160 and coupled to global lines for supplying voltages for operations.

The voltage supply unit 150 generates voltages used for program and verification operations and a data read or erase operation and supplies the generated voltages to the global lines.

The control unit 160 outputs control signals for program, program verification, data read, and erase operations.

Figure 1B:
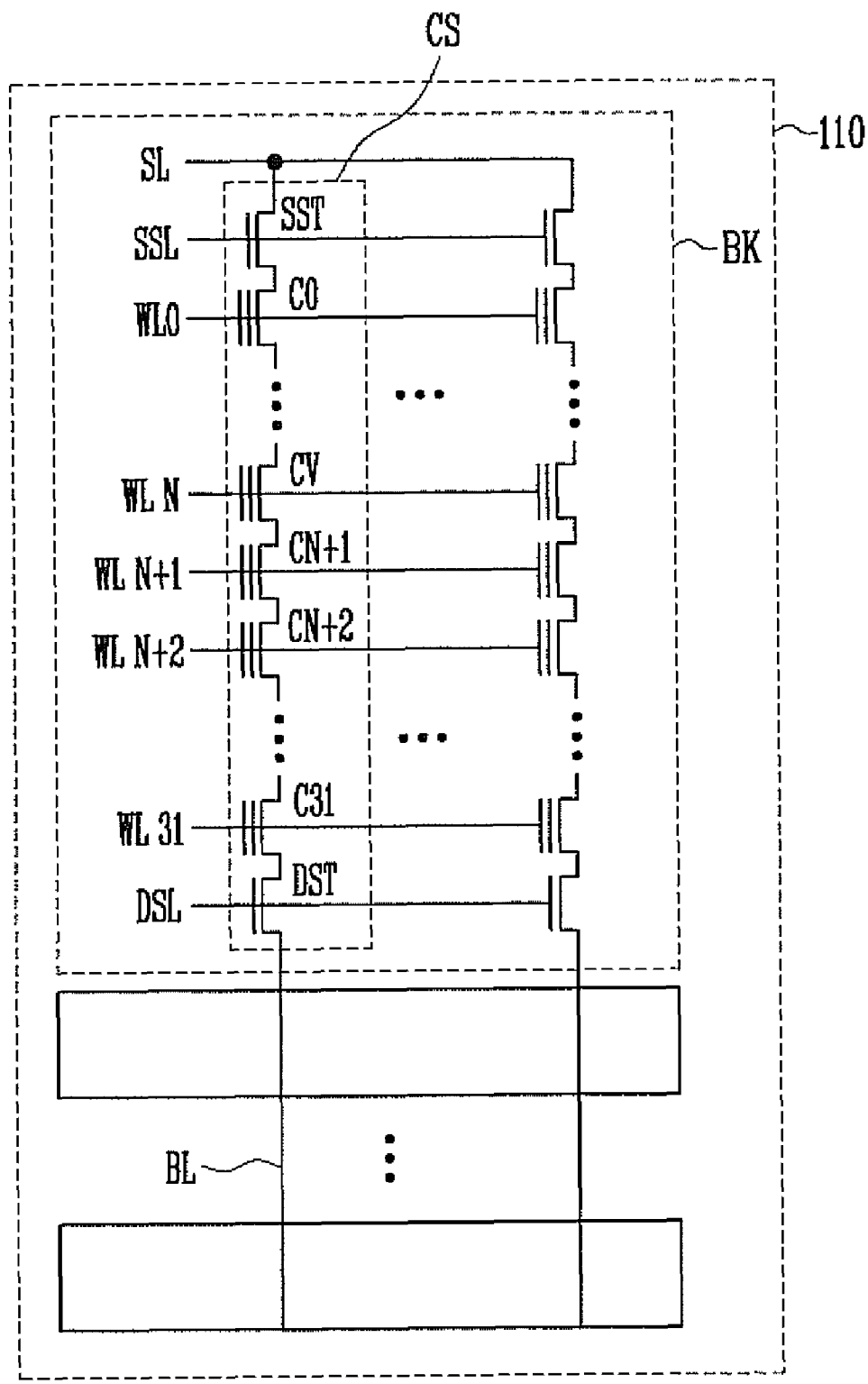
FIG. 1B is a detailed diagram showing one of the memory blocks of a memory cell array shown in FIG. 1A.

FIG. 1B is a detailed diagram showing one of the memory blocks BK of the memory cell array shown in FIG. 1A.

Referring to FIG. 1B, the memory cell array 110 includes the plurality of memory blocks BK. Each of the memory blocks BK includes a plurality of cell strings CS. Each of the cell strings CS includes first to thirty-second memory cells C0 to C31, a drain select transistor DST and a source select transistor SST.

The drains of the drain select transistors DST of the cell strings CS are coupled to the respective bit lines BL, and the sources of the source select transistors SST thereof are coupled to a common source line SL.

The gates of the drain select transistors DST are coupled to a drain selection line DSL in common, and the gates of the source select transistors SST are coupled to a source selection line SSL in common.

The gates of the first to thirty-second memory cells C0 to C31 are respectively coupled to first to thirty-second word lines WL0 to WL31.

The page buffer PB coupled to one or more bit lines BL is constructed as follows.

Figure 1C:
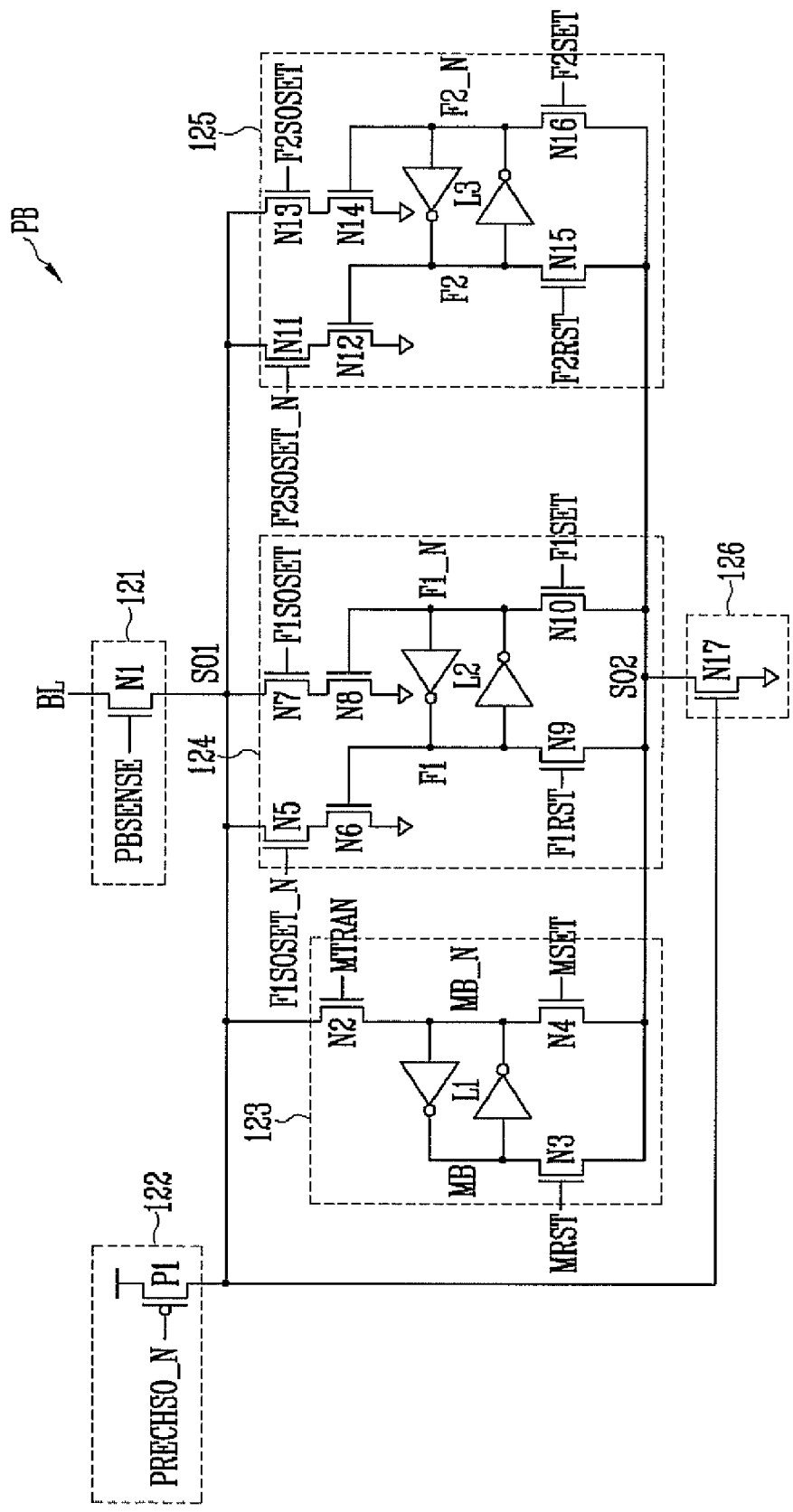
FIG. 1C is a circuit diagram of a page buffer shown in FIG. 1A.

FIG. 1C is a circuit diagram of the page buffer PB shown in FIG. 1A.

Referring to FIG. 1C, the page buffer PB includes a first sense unit 121, a precharge unit 122, first to third latch units 123 to 125, and a second sense unit 126.

The first sense unit 121 is coupled between the bit line BL and a first sense node SO1 and configured to sense a voltage of the bit line BL to change a voltage level of the first sense node SO1.

The precharge unit 122 precharges the first sense node SO1. The first latch unit 123 is configured to store data to be programmed and used for a data program operation. The second and third latch units 124 and 125 are used to store flag information. The second and third latch units 124 and 125 are used to identify one of the distributions of a threshold voltage that will be used to program a memory cell and to control a verification operation.

The second sense unit 126 senses a voltage level of the first sense node SO1 and couples a second sense node SO2 to a ground node.

The page buffer PB further includes a cache latch for a cache program and a data input and output circuit for data input and output. However, FIG. 1B shows only those parts that are relevant for illustrating the exemplary embodiment of the present disclosure.

The circuit configuration of the page buffer PB is described in more detail below.

The first sense unit 121 includes a first NMOS transistor N1. The precharge unit 122 includes a first PMOS transistor P1.

The first to third latch units 123 to 125 include second to sixteenth NMOS transistors N2 to N16 and first to third latches L1 to L3. The second sense unit 126 includes a seventeenth NMOS transistor N17.

The first NMOS transistor N1 is coupled between the bit line BL and the first sense node SO1. A sense control signal PBSENSE is inputted to the gate of the first NMOS transistor N1.

The first PMOS transistor P1 is coupled between a power source input terminal and the first sense node SO1. A precharge control signal PRECHSO_NO is inputted to the gate of the first PMOS transistor P1.

The second NMOS transistor N2 is coupled between the first sense node SO1 and node MB_N. A first data transfer signal MTRAN is inputted to the gate of the second NMOS transistor N2.

The first latch L1 is coupled between node MB and the node MB_N. The first latch L1 is a latch circuit having two cross-coupled inverters.

The third NMOS transistor N3 is coupled between the node MB and the second sense node SO2. The fourth NMOS transistor N4 is coupled between the node MB_N and the second sense node SO2.

A first reset signal MRST is inputted to the gate of the third NMOS transistor N3. A first set signal MSET is inputted to the gate of the fourth NMOS transistor N4.

The fifth and sixth NMOS transistors N5 and N6 are coupled between the first sense node SO1 and a ground node. A second data transfer signal F1SOSET_N is inputted to the gate of the fifth NMOS transistor N5. A node F1 is coupled to the gate of the sixth NMOS transistor N6.

The seventh and eighth NMOS transistors N7 and N8 are coupled between the first sense node SO1 and the ground node. A third data transfer signal F1SOSET is inputted to the gate of the seventh NMOS transistor N7. A node F1_N is coupled to the gate of the eighth NMOS transistor N8.

The second latch L2 is coupled between the node F1 and the node F1_N. The second latch L2 includes two cross-coupled inverters.

The ninth NMOS transistor N9 is coupled between the node F1 and the second sense node 502. The tenth NMOS transistor N10 is coupled between the node F1_N and the second sense node SO2. A second reset signal F1RST is inputted to the gate of the ninth NMOS transistor N9. A second set signal F1SET is inputted to the gate of the tenth NMOS transistor N10.

The eleventh and twelfth NMOS transistors N11 and N12 are coupled between the first sense node SO1 and the ground node. A fourth data transfer signal F2SOSET_N is inputted to the gate of the eleventh NMOS transistor N11. The gate of the twelfth NMOS transistor N12 is coupled to node F2.

The thirteenth and fourteenth NMOS transistors N13 and N14 are coupled between the first sense node SO1 and the node F2_N. A fifth data transfer signal F2SOSET is inputted to the gate of the thirteenth NMOS transistor N13. The gate of the fourteenth NMOS transistor N14 is coupled to node F2_N.

The third latch L3 is coupled between the node F2 and the node F2_N. The third latch L3 includes two cross-coupled inverters.

The fifteenth NMOS transistor N15 is coupled between the node F2 and the second sense node SO2. The sixteenth NMOS transistor N16 is coupled between the node F2_N and the second sense node 502.

A third reset signal F2RST is inputted to the gate of the fifteenth NMOS transistor N15. A third set signal F2SET is inputted to the gate of the sixteenth NMOS transistor N16.

The seventeenth NMOS transistor N17 is coupled between the second sense node SO2 and the ground node. The gate of the seventeenth NMOS transistor N17 is coupled to the first sense node SO1.

As a result of performing a program operation using the above-described page buffer PB, the memory cells of the memory cell array 110 have the following distributions of threshold voltages.

Figure 2:
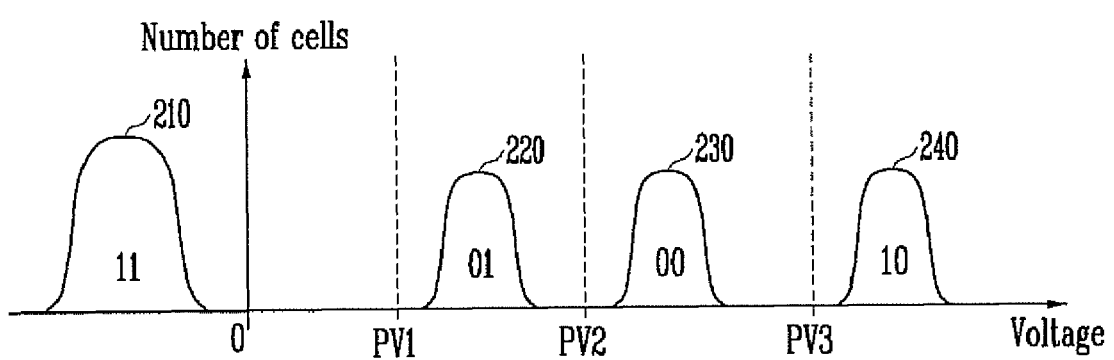
FIG. 2 is a diagram showing the distributions of threshold voltages of memory cells on which a program operation has been performed according to an exemplary embodiment of the present disclosure.

FIG. 2 is a diagram showing the distributions of threshold voltages of the memory cells on which a program operation has been performed according to an exemplary embodiment of the present disclosure.

Referring to FIG. 2, after program operations for a least significant bit (LSB) page and a most significant bit (MSB) page are completed, a threshold voltage of the memory cells initially at a first threshold voltage distribution 210 (i.e., an erase cell state) may remain at the first threshold voltage distribution 210 or shift to any one of second to fourth threshold voltage distributions 220 to 240.

Hereinafter, only a method of programming a most significant bit (MSB) page after a least significant bit (LSB) page is programmed is illustrated as an example.

The program operation according to the exemplary embodiment of the present disclosure is described below in relation to, for example, the page buffer PB, having the above-described circuit configuration.

FIG. 3 is a timing diagram illustrating the program operation of the nonvolatile memory device according to an exemplary embodiment.

Referring to FIG. 3, to perform the program operation, the nonvolatile memory device 100 first precharge all the bit lines BL. Next, the precharge state of a selected bit line is maintained or the selected bit line is discharged according to a data state stored in the page buffer PB coupled to the selected bit line.

The program operation is performed on a page by page basis by supplying a program voltage to a corresponding word line. Thus, the nonvolatile memory device 100 precharges all bit lines including those coupled to memory cells that should be program-inhibited to prevent/reduce channel boosting.

Accordingly, the amount of current consumed during the time that the bit lines are discharged is varied depending on the number of memory cells to be programmed in one page. In other words, with an increase in the number of memory cells to be programmed, the number of bit lines subject to being discharged, from among precharged bit lines, also increases. Thus, the overall discharge current increases.

Figure 4A:
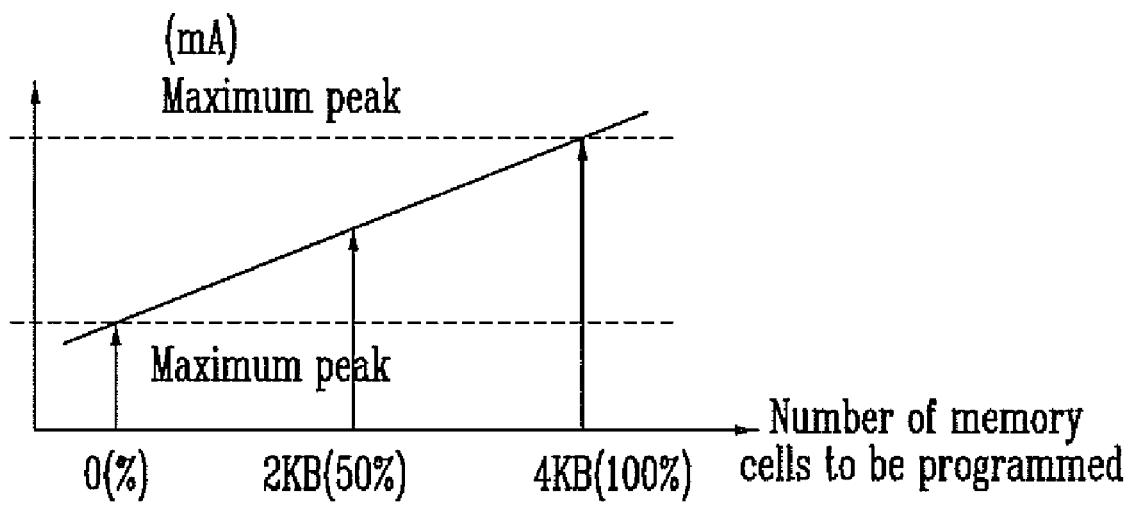
FIGS. 4A to 4C are diagrams showing the amounts of the discharge current according to the number of memory cells to be programmed amounts of a bit line discharge current according to the number of memory cells to be programmed.
Figure 4B:
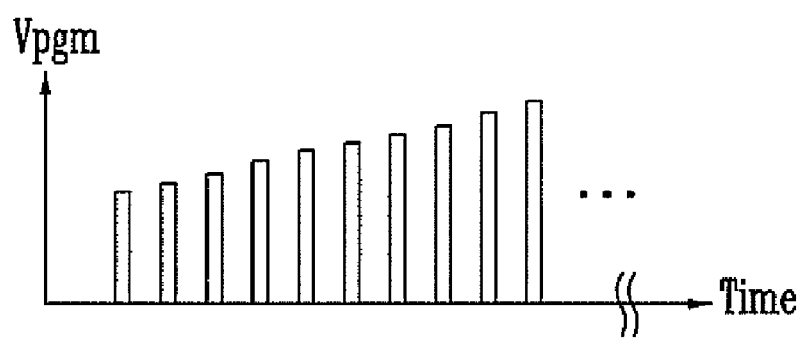
Figure 4C:
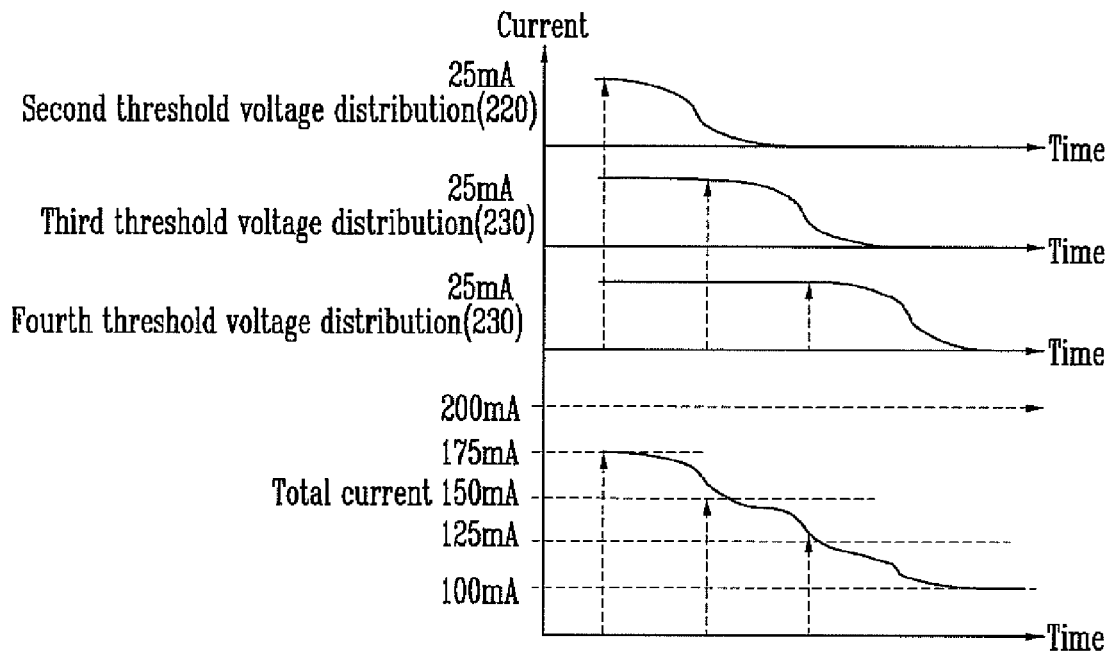

FIGS. 4A to 4C are diagrams showing the amounts of the discharge current according to the number of memory cells to be programmed.

From FIG. 4A, it can be seen that the discharge current rises with an increase in the number of memory cells to be programmed.

Furthermore, from FIGS. 4B and 4C, it can be seen that a program voltage rises with each repetition of a program pulse, and discharge current decreases as a program operation progresses. This is because, as the program operation progresses, the number of memory cells, completely programmed and changed into a program-inhibition state, is increased.

In particular, in a multi-level cell (MLC) capable of storing data of 2 bits or more, a decrease in the discharge current as a program operation progresses is seen with programming for each threshold voltage distribution.

In discharging current in programming for each threshold voltage distribution shown in FIG. 2, memory cells to be programmed with the second threshold voltage distribution 220 are program-inhibited after the initial program operation because they are programmed when a program voltage Vpgm is initially supplied.

It can be seen that the time for discharging current is longer for programming the third and fourth threshold voltage distributions 230 and 240. This is because memory cells to be programmed with the third and fourth threshold voltage distributions 230 and 240 reaches a program pass state when the program voltage Vpgm rises up to a certain level.

Accordingly, it can be seen that a total amount of discharge current decreases with a rise in the program voltage Vpgm or with the program pulse.

In the exemplary embodiment of the present disclosure, a memory cell that should be programmed with a high threshold voltage does not reach a program pass state until the program voltage Vpgm rises up to a certain level. Here, the program speed for the memory cell to be programmed with a high threshold voltage does not significantly differ between a case where the program voltage Vpgm is supplied starting from a low voltage to a high voltage and a case where a high program voltage Vpgm is supplied at once. For this reason, a method of program-inhibiting memory cells is used where memory cells to be programmed with a high threshold voltage distribution are program-inhibited until a certain program pulse or a certain program voltage is reached.

Figure 5D:
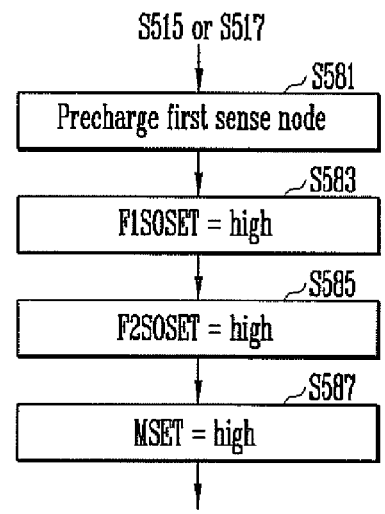
FIG. 5D is a flowchart illustrating a second data setting process shown in FIG. 5A.
Figure 5A:
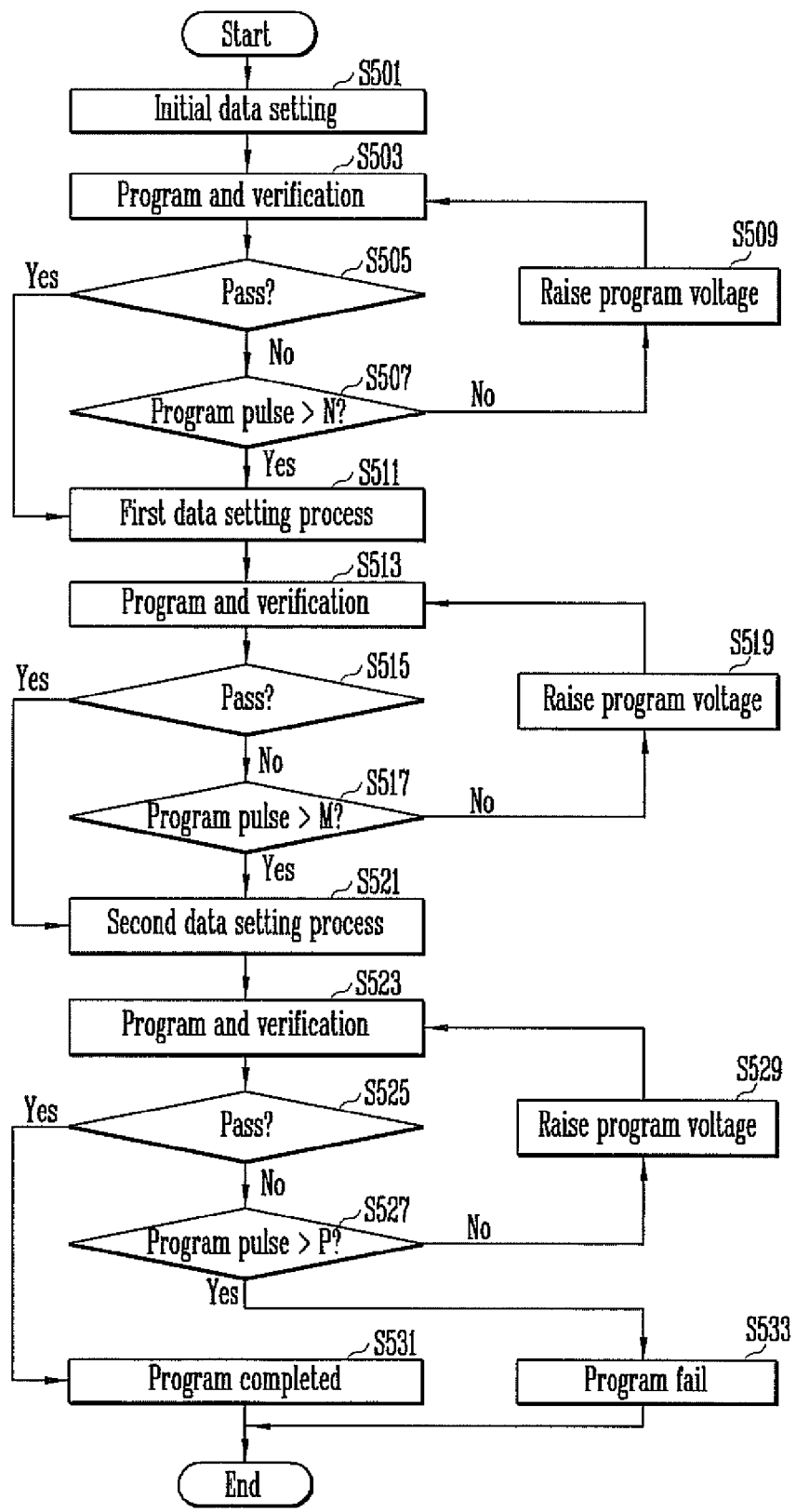
FIG. 5A is a flowchart illustrating a program operation according to an exemplary embodiment of the present disclosure.

FIG. 5A is a flowchart illustrating a program operation according to an exemplary embodiment of the present disclosure.

In the exemplary embodiment of the present disclosure, an example in which multi-level cells (MLCs), each capable of storing 2 bits of data, are programmed. With an assumption that a program operation on a least significant bit (LSB) page is completed already, for example, by a same method, and only a program operation on a most significant bit (MSB) page is described below.

Through the program operation for the most significant bit (MSB) page, the threshold voltages of corresponding memory cells are set to the first to fourth threshold voltage distributions 210 to 240. Here, A, B, C, and D represent four cases in which the corresponding memory cells are to be programmed with the first to fourth threshold voltage distributions 210 to 240, respectively.

For the purpose of the MSB page program operation, data states stored in the first to third latches L1 to L3 of the page buffer PB are set at step S501.

Table 1 below shows an example in which data are inputted to the first to third latches L1 to L3 according to the cases A, B, C, and D.

TABLE 1

|  | A | B | C | D |
|---|---|---|---|---|
| MB_N | 1 | 0 | 0 | 0 |
| F1_N | 0 | 1 | 1 | 0 |
| F2_N | 1 | 1 | 0 | 0 |

After the initial data of MB_N, F1_N, and F2_N are inputted as described above, the memory cells corresponding to the cases C and D but not memory cells corresponding to the case B are prevented/inhibited from being programmed. The initial data are set for this purpose.

Figure 5B:
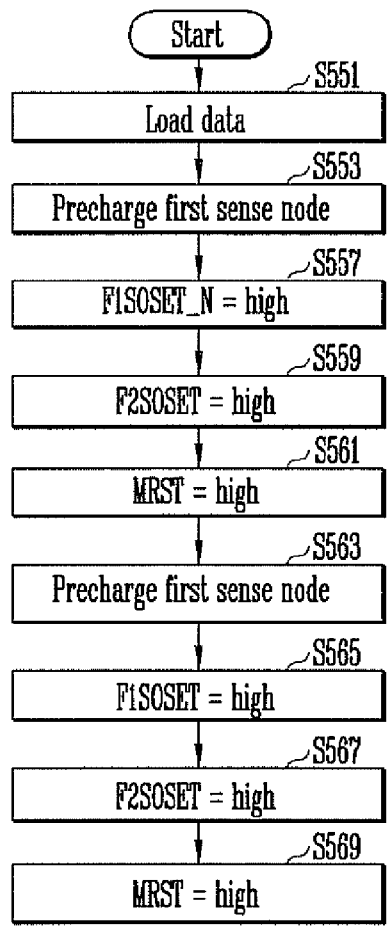
FIG. 5B is a flowchart illustrating a data setting process shown in FIG. 5A.

FIG. 5B is a flowchart illustrating the data setting process shown in FIG. 5A.

For the initial data setting S501, the data are loaded as shown in Table 1 at step S551.

Next, the first sense node SO1 is precharged at step S553. With the first sense node SO1 having been precharged, the second data transfer signal F1SOSET_N of a high level is supplied at step S557, and the fifth data transfer signal F2SOSET of a high level is supplied at step S559, thereby changing a voltage of the first sense node SO1. Next, the first reset signal MRST of a high level is supplied to the first latch unit 123, thus changing a data state of the first latch L1 at step S561.

After the steps S553 to S561, a data state of the node MB_N changes from a state '0' to a state '1' in, for example, the case of C, which is for programming memory cells with the third distribution of threshold voltages.

Next, the first sense node SO1 is precharged again at step S563. The third data transfer signal F1SOSET of a high level is supplied at step S565, and the fifth data transfer signal F2SOSET of a high level is supplied at step S567, thereby changing a voltage of the first sense node SO1.

Next, the first reset signal MRST of a high level is supplied, thus changing a data state of the node MB_N at step S569.

More specifically, in the cases of A, B, C, and D according to the data setting process, a change in the data state of the node MB_N is described below.

First, in the case of A, a data state of the node MB_N is '1', a data state of the node F1_N is '0', and a data state of the node F2_N is '1'.

When the first sense node SO1 is precharged and the second data transfer signal F1SOSET_N of a high level is then supplied, the fifth NMOS transistor N5 is turned on. Since the data of the node F1_N have a state '0', data of the node F1 have a state '1'. Accordingly, the sixth NMOS transistor N6 is also turned on. That is, the first sense node SO1 is discharged. If the first sense node SO1 is discharged, the first sense node SO1 maintains the discharge state irrespective of a data state of the node F2_N when the fifth data transfer signal F2SOSET of a high level is subsequently supplied.

Further, if the first sense node SO1 is discharged, the data state of the node MB_N is not changed. Thus, in the case of A, the data state '1' at the node MB_N remains intact.

Meanwhile, in the case of A, when the first sense node SO1 is precharged again and the third data transfer signal F1SOSET of a high level is then supplied, the seventh NMOS transistor N7 is turned on. However, the first sense node SO1 is not discharged because the node F1_N has a data state '0'.

Next, when the fifth data transfer signal F2SOSET of a high level is supplied, the thirteenth NMOS transistor N13 is turned on. In this case, since the node F2_N has a data state '1', the fourteenth NMOS transistor N14 is also turned on. Accordingly, the first sense node SO1 is discharged, and data of the node MB_N are not changed. In the case of A, as a result of performing the steps S551 to S569, the initial loading state ("1" at the node MB_N) is maintained after the initial data setting step S501 in FIG. 5A.

The case B corresponding to programming of memory cells with the second threshold voltage distribution is described below.

First, in the state in which the first sense node SO1 is precharged, the second data transfer signal F1SOSET_N of a high level is supplied. In this case, the first sense node SO1 is not discharged because the node F1 has a data state '0'. When the fifth data transfer signal F2SOSET of a high level is supplied, the thirteenth NMOS transistor N13 is turned on. Here, the node F2_N has a data state '1'. Accordingly, the data state of the node MB_N is not changed because the first sense node SO1 is discharged.

Next, when the first sense node SO1 is precharged again and the third data transfer signal F1SOSET of a high level is then supplied, the seventh NMOS transistor N7 is turned on. In this case, the first sense node SO1 is discharged because the node F1_N has a data state '1'. That is, the data state of the node MB_N is not changed. In the case of B, as a result of performing the steps S551 to S569, the initial data loading state ("0" at the node MB_N) is not changed.

The case C corresponding to programming of memory cells with the third threshold voltage distribution is described below.

When the second data transfer signal F1SOSET_N of a high level is supplied with the first sense node SO1 having been precharged, the fifth NMOS transistor N5 is turned on. In this case, the first sense node SO1 is not discharged because the node F1 has a data state '0'.

Next, when the fifth data transfer signal F2SOSET of a high level is supplied, the thirteenth NMOS transistor N13 is turned on. However, the first sense node SO1 is maintained in the precharge state because the node F2_N has a data state '0'. Accordingly, the seventeenth NMOS transistor N17 remains turned on, and the second sense node SO2 is coupled to the ground node.

When the first reset signal MRST of a high level is supplied, the third NMOS transistor N3 is turned on. Thus, the data state of the node MB_N changes to '1' because the node MB is coupled to the ground node.

In the state in which the data state of the node MB_N has changed to '1', when the first sense node SO1 is precharged and the third data transfer signal F1SOSET of a high level is supplied, the seventh NMOS transistor N7 is turned on. In this case, the first sense node SO1 is discharged because the node F1_N has a data state '1'. Accordingly, the node MB_N maintains the data state '1'.

As a result of the initial data set, in the case of C corresponding to programming of memory cells with the third threshold voltage distribution, the data state of the node MB_N changes from '0' to '1', and so program-inhibition is set.

The case D corresponding to programming of memory cells with the fourth threshold voltage distribution is described below.

When the first sense node SO1 is precharged and the second data transfer signal F1SOSET_N of a high level is then supplied, the fifth NMOS transistor N5 is turned on. Here, the node F1 has a data state '1'. Accordingly, the first sense node SO1 is discharged, and so the data state of the node MB_N is not changed.

Next, when the first sense node SO1 is precharged and the third data transfer signal F1SOSET of a high level is then supplied, the seventh NMOS transistor N7 is turned on. In this case, the first sense node SO1 maintains the precharge state because the node F1_N has a data state '0'.

Next, when the fifth data transfer signal F2SOSET of a high level is supplied, the thirteenth NMOS transistor N13 is turned on. However, the first sense node SO1 maintains the precharge state because the node F2_N has a data state '0'.

Accordingly, when the first reset signal MRST of a high level is supplied, the data state of the node MB_N changes from '0' to '1' in the case of D. In other words, program-inhibition is set in the case of D corresponding to programming of memory cells with the fourth threshold voltage distribution.

Data of the first to third latches are set for each of the cases A, B, C, and D as shown in Table 2 by performing the steps of FIG. 5B to the above-described data in Table 1.

TABLE 2

|      | A | B | C | D |
|------|---|---|---|---|
| MB_N | 1 | X | 1 | 1 |
| F1_N | 0 | 1 | 1 | 0 |
| F2_N | 1 | 1 | 0 | 0 |

In Table 2, mark 'x' indicates that the case B changes to data state '1' when the memory cells corresponding to the case B become a program pass.

After the initial data setting process is completed as described above, program and verification operations are performed at step S503. In performing the program and verification operations at step S503, the program verification operation has only to be performed using a first verification voltage PV1 because only the program operation for the case B corresponding to programming of memory cells with the second threshold voltage distribution is performed and program-inhibition has been set for the cases C and D, where the memory cells programmed with the cases C and ID are program-inhibited. Accordingly, current consumption can be reduced because the number of bit lines being discharged can be reduced.

It is then determined whether the memory cells programmed corresponding to the case B are a program pass at step S505. If, as a result of the determination, the corresponding memory cells are determined to be a program pass, the program operation on all the memory cells programmed to have the second threshold voltage distribution corresponding to the case B is considered to be completed. Next, a first data setting process is performed at step S511. Further, in the program pass, all the memory cells programmed to have the second threshold voltage distribution (the case B) are in a program state. Accordingly, in a subsequent program verification operation, a verification operation using the first verification voltage PV1 is inhibited, thereby reducing the time used for performing the program verification operation.

However, if, as a result of the determination at step S505, the corresponding memory cells are determined to not be a program pass, a program pulse is supplied again. It is determined whether the program pulse has been supplied more than N times at step S507. If, as a result of the determination, the program pulse is determined to not have been supplied more than N times, the program voltage Vpgm is raised by a step voltage at step S509, the program and verification operations are performed again at step S503.

However, if, as a result of the determination at step S507, the program pulse is determined to have been supplied more than N times, the first data setting process is performed at step S511. Thus, The program operation for programming of memory cells with the third threshold voltage distribution corresponding to the case C is performed after all the memory cells to be programmed with the case B have been programmed or the program pulse is supplied more than N times.

To this end, the first data setting process is performed.

The first data setting process at step S511 is described in detail below with reference to FIG. 5C.

Figure 5C:
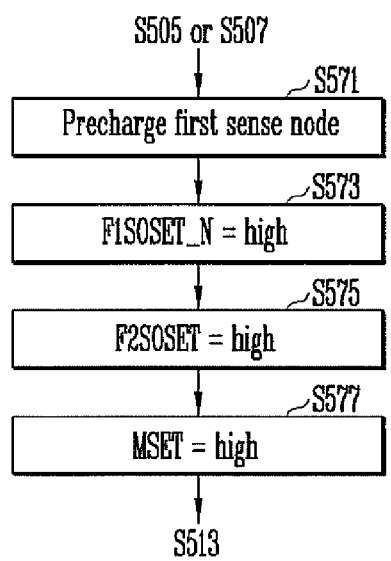
FIG. 5C is a flowchart illustrating a first data setting process shown in FIG. 5A.

FIG. 5C is a flowchart illustrating the first data setting process shown in FIG. 5A.

Referring to FIG. 5C, first, the first sense node SO is precharged at step S571. Next, the second data transfer signal F1SOSET_N of a high level is supplied at step S573 and the fifth data transfer signal F2SOSET of a high level is supplied at step S575, thereby changing a voltage level of the first sense node SO1. Next, the first set signal MSET of a high level is supplied, thus changing the data state of the node MB_N at step S577.

More specifically, in the case of A corresponding to programming of memory cells with the first threshold voltage distribution, when the first sense node SO1 is precharged and the second data transfer signal F1SOSET_N of a high level is then supplied, the fifth NMOS transistor N5 is turned on. In this case, the node F1 has a data state '1'. The data state of the node MB_N (previously "1" as shown for case A in Table 2) is not changed because the first sense node SO1 is discharged.

In the case of B corresponding to programming of memory cells with the second threshold voltage distribution, when the first sense node SO1 is precharged and the second data transfer signal F1SOSET_N of a high level is then supplied, the fifth NMOS transistor N5 is turned on. Furthermore, the first sense node SO1 maintains the precharge state because the node F1 has a data state '0'.

Next, when the fifth data transfer signal F2SOSET of a high level is supplied, the thirteenth NMOS transistor N13 is turned on. The first sense node SO1 is discharged because the node F2_N has a data state '1'. Accordingly, the data state of the node MB_N is not changed.

In the case of C corresponding to programming of memory cells with the third threshold voltage distribution, when the first sense node SO1 is precharged and the second data transfer signal F1SOSET_N of a high level is then supplied, the fifth NMOS transistor N5 is turned on. The first sense node SO1 maintains the precharge state because the node F1 has a data state '0'.

Next, when the fifth data transfer signal F2SOSET of a high level is supplied, the thirteenth NMOS transistor N13 is turned on. Accordingly, since the node F2_N has a data state '0', the first sense node SO1 maintains the precharge state, and the seventeenth NMOS transistor N17 also remains turned on.

When the first set signal MSET of a high level is supplied, a data state of the node MB_N (previously "1" for the case C as shown in Table 2) changes to '0' because the fourth NMOS transistor N4 is turned on. Accordingly, a subsequent program operation can be performed.

In the case of D corresponding to programming of memory cells with the fourth threshold voltage distribution, when the first sense node SO1 is precharged and the second data transfer signal F1SOSET_N of a high level is then supplied, the fifth NMOS transistor N5 is turned on. In this case, since the node F1 has a data state '1', the first sense node SO1 is discharged, and the data state of the node MB_N (previously "1" for the case D as shown in Table 2) is not changed.

If the first data setting process is performed as shown in FIG. 5C, in the case of C, the data state of the node MB_N changes to '0'. Accordingly, when a subsequent program operation is performed, a bit line discharge operation can be performed for programming of memory cells with the third threshold voltage distribution corresponding to the case C. When the bit lines are discharged, the program operation is completed.

That is, after the first data setting process, program and verification operations are performed at step S513. It is then determined whether the memory cells programmed to have the second threshold voltage distribution (if some memory cells to be programmed with the second threshold voltage distribution were not successfully programmed at steps S503-S509) and third threshold voltage distribution corresponding to the cases B and C, respectively, are a program pass at step S515. If, as a result of the determination, the corresponding memory cells are determined to be a program pass, the program operation on all the memory cells programmed to have the second or third threshold voltage distributions corresponding to cases B and C is considered to be complete. Next, a second data setting process is performed at step S521. The second data setting process is an operation of changing a data state of the node MB_N of the page buffer PB to which the memory cells to be programmed with the fourth threshold voltage distribution corresponding to the case D so as to have the data state '0'.

However, if, as a result of the determination at step S515, the corresponding memory cells are determined to not be a program pass, a program pulse is supplied again. It is determined whether the program pulse has been supplied more than M times at step S517. Here, 'M' is a natural number greater than 'N'. That is, the first data setting process is performed such that a program operation can be performed on the memory cells to be programmed with the third threshold voltage distribution corresponding to the case C after the program pulse is supplied N times. Next, the program operations are performed only on the memory cells to be programmed with the second and third threshold voltage distributions corresponding respectively to cases B and C by supplying the program pulse M times.

If, as a result of the determination at step S517, the program pulse is determined to not have been supplied more than M times, the program voltage Vpgm is raised by a step voltage at step S519, and the process returns to step S513 in which the program and verification operations are repeated.

However, if, as a result of the determination at step S517, the program pulse is determined to have been supplied more than M times, the second data setting process is performed at step S521.

FIG. 5D is a flowchart illustrating the second data setting process shown in FIG. 5A.

Referring to FIG. 5D, first, the first sense node SO1 is precharged at step S581. Next, the third data transfer signal F1SOSET of a high level is supplied at step S583 and the fifth data transfer signal F2SOSET of a high level is supplied at step S585, thereby changing the voltage of the first sense node SO1.

Next, the first set signal MSET of a high level is supplied, thus changing the data state of the node MB_N.

More specifically, in the case of A, when the first sense node SO1 is precharged and the third data transfer signal F1SOSET of a high level is then supplied, the seventh NMOS transistor N7 is turned on. The node F1_N has a data state '0', and the first sense node SO1 maintains the precharge state.

When the fifth data transfer signal F2SOSET of a high level is supplied, the thirteenth NMOS transistor N13 is turned on. Thus, since the node F2_N has a data state '1', the first sense node SO1 is discharged, and the data state of the node MB_N is not changed.

In the case of B, when the first sense node SO1 is precharged and the third data transfer signal F1SOSET of a high level is then supplied, the seventh NMOS transistor N7 is turned on. The first sense node SO1 is discharged because the node F1_N has a data state '1'. Accordingly, the data state of the node MB_N is not changed.

In the case of C, since the node F1_N has a data state '1', the first sense node SO1 is discharged, and so the data state of the node MB_N is not changed.

In the case of D, the node F1_N has a data state '0'. Accordingly, even though the seventh NMOS transistor N7 is turned on, the first sense node SO1 maintains the precharge state. Next, when the fifth data transfer signal F2SOSET of a high level is supplied, the thirteenth NMOS transistor N13 is turned on.

Since the node F2_N has a data state '0', the first sense node SO1 maintains the precharge state, and the seventeenth NMOS transistor N17 remains turned on. When the first set signal MSET of a high level is supplied, the fourth NMOS transistor N4 is turned on, and the node MB_N has a data state '0'.

Accordingly, only in the case of D, the data state of the node MB_N is changed by the second data setting process.

After the second data setting process is completed, program and verification operations are performed at step S523. It is then determined whether the program verification operation is a pass at step S525. If, as a result of the determination, the program verification operation is determined to be a pass, the program operations are completed at step S531.

However, if, as a result of the determination at step S525, the program verification operation is determined to not be a pass, it is determined whether a program pulse has been supplied more than P times at step S527. Here, 'P' is a natural number greater than 'M' and it indicates a maximum number of program pulses that can be supplied.

If, as a result of the determination at step S527, the program pulse is determined to have been supplied more than P times, no further program operation is performed, program state information is indicated to be a fail, and the program operations are finished at step S533.

However, if, as a result of the determination at step S527, the program pulse is determined not to have been supplied more than P times, the program voltage Vpgm is raised again at step S529, and the process returns to step S523.

According to an exemplary embodiment, program operations for memory cells to be programmed with a high threshold voltage may be inhibited until the number of applied program pulses reaches a certain number of times or more. Accordingly, current consumed when the bit lines are discharged can be reduced.

Figure 6A:
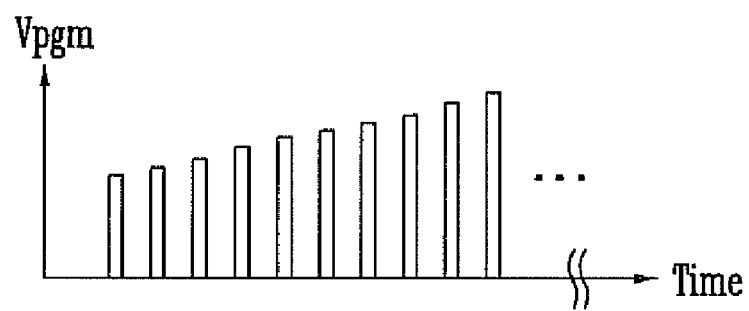
FIGS. 6A and 6B are diagrams showing the amounts of current during the time in which the program operation according to the exemplary embodiment of the present disclosure is performed.
Figure 6B:
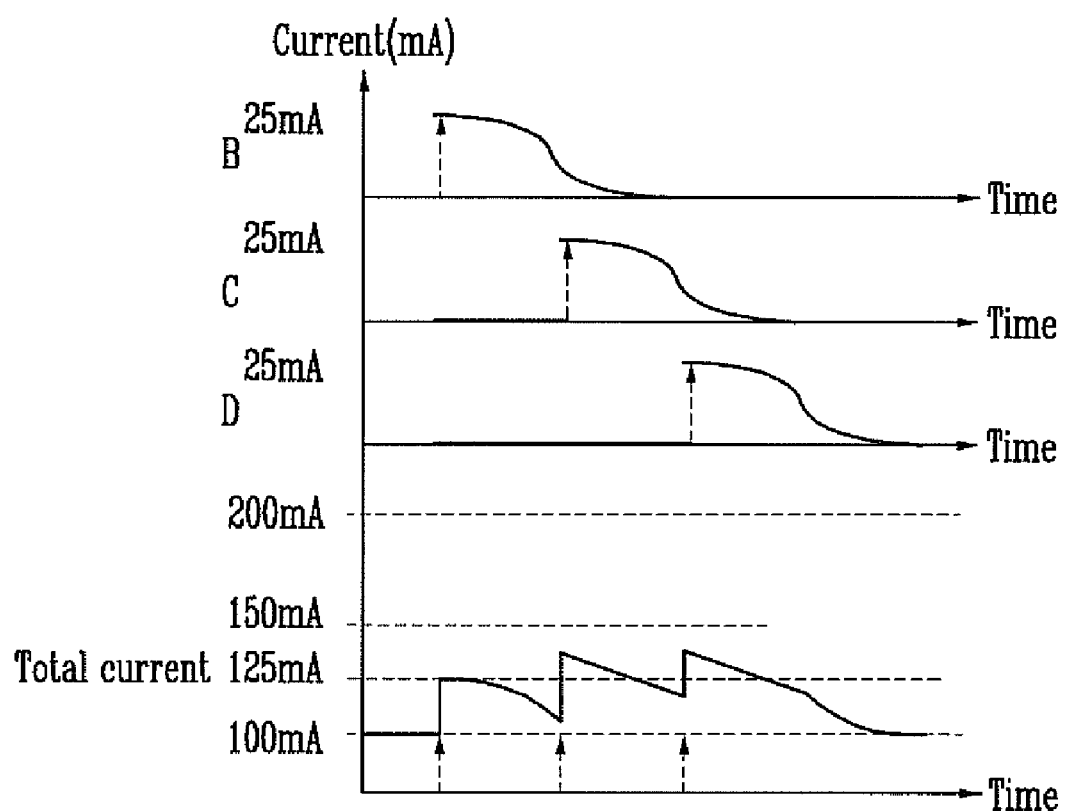

FIGS. 6A and 6B are diagrams showing discharged currents during the time in which the program operation according to the exemplary embodiment of the present disclosure is performed.

Referring to FIG. 6A, while the program voltage Vpgm is supplied in response to a program pulse, program operations for appropriate memory cells to be programmed with the second, third, and fourth threshold voltage distributions corresponding to cases B, C, and D, respectively, are prevented/inhibited. Accordingly, current consumption can be reduced.

Accordingly, a total current consumption can be significantly reduced as compared with the total current consumption shown in FIG. 4B.

Furthermore, according to an example, during the time for which a program-inhibition operation is performed, a verification operation for the inhibited programming operation for a corresponding threshold voltage distribution may also be inhibited/prevented. Accordingly, the time that it takes to perform the entire program operation can be reduced because the number of verification operations is reduced.

As described above, according to the method of programming a nonvolatile memory device in accordance with the present disclosure, when a program verification operation is performed, memory cells to be programmed with a high threshold voltage distribution are program-inhibited until a program voltage rises up to a certain voltage. Accordingly, in the program operation, current consumption from the bit lines being discharged can be reduced. Furthermore, the time that it takes to perform the entire program operation may be reduced by not performing verification operations corresponding to inhibited programming operations.

What is claimed is:

1. A method of programming a nonvolatile memory device, where the nonvolatile memory device has memory cells and each memory cell has one of first and second threshold voltage distributions, the method comprising:
   an initial data setting step of inputting data for program inhibition to a first latch of a page buffer to which memory cells to be programmed with the second threshold voltage distribution are coupled;
   a first program and verification step of performing program and verification operations;
   a first data setting step of, when a program pulse is supplied more than N times (where N is a natural number), inputting data for performing a program operation to the first latch of the page buffer to which the memory cells to be programmed with the second threshold voltage distribution are coupled; and
   a second program and verification step of performing program and verification operations.

2. The method of claim 1, wherein a threshold voltage of memory cells having the first threshold voltage distribution is less than a threshold voltage of memory cells having the second threshold voltage distribution.

3. The method of claim 1, wherein when performing the verification operation in the first program and verification step, the verification operation is not performed on the memory cells to be programmed with the second threshold voltage distribution.

4. The method of claim 3, wherein when performing the verification operation in the second program and verification step, the verification operation is sequentially performed on the memory cells to be programmed with the first threshold voltage distribution and the memory cells to be programmed with the second threshold voltage distribution.

5. A method of programming a nonvolatile memory device, where the nonvolatile memory device has memory cells and each memory cell has one of first to fourth threshold voltage distributions, the method comprising:
   an initial data setting step of inputting data for program inhibition to a first latch of a page buffer to which memory cells to be programmed with the third and fourth threshold voltage distributions are coupled;
   a first program and verification step of performing program and verification operations;
   a first data setting step of, when a program pulse is supplied more than N times (where N is a natural number), inputting data for performing a program operation to the first latch of the page buffer to which the memory cells to be programmed with the third threshold voltage distribution are coupled;
   a second program and verification step of performing program and verification operations;
   a second data setting step of, when the program pulse is supplied more than M times (where M>N and M is a natural number), inputting data for performing a program operation to the first latch of the page buffer to which the memory cells to be programmed with the fourth threshold voltage distribution are coupled; and
   a third program and verification step of performing program and verification operations.

6. The method of claim 5, wherein:
memory cells to be programmed with the first threshold voltage distribution are in an erase state,
a threshold voltage of the memory cells programmed to have the third threshold voltage distribution is higher than a threshold voltage of memory cells programmed to have the second threshold voltage distribution, and
a threshold voltage of the memory cells programmed to have the fourth threshold voltage distribution is higher than a threshold voltage of the memory cells programmed to have the third threshold voltage distribution.

7. The method of claim 6, wherein the initial data setting step comprises the steps of:
inputting the data to be programmed to the first latch and inputting data to second and third latches of the page buffer according to specific threshold voltage distributions of the data to be programmed from the first to fourth threshold voltage distributions; and
changing a state of the data of the first latch in response to states of the data of the second and third latches.

8. The method of claim 7, wherein the step of changing a state of the data of the first latch according to states of the data of the second and third latches comprises the steps of:
precharging a sense node of the page buffer;
discharging the sense node in response to a data state of a first node of the second latch, discharging the sense node in response to a data state of a first node of the third latch, and then changing the data of the first latch in response to a voltage level of the sense node; and
discharging the sense node in response to a data state of a second node of the second latch, discharging the sense node in response to the data state of the first node of the third latch, and then changing the data of the first latch in response to a voltage level of the sense node.

9. The method of claim 8, wherein the first data setting step comprises the steps of:
precharging the sense node; and
discharging the sense node in response to a data state of the first node of the second latch, discharging the sense node in response to the data state of the first node of the third latch, and then changing the data of the first latch in response to a voltage level of the sense node.

10. The method of claim 8, wherein the second data setting step comprises the steps of:
precharging the sense node; and
discharging the sense node in response to a data state of the second node of the second latch, discharging the sense node in response to the data state of the first node of the third latch, and then changing the data of the first latch in response to a voltage level of the sense node.

11. The method of claim 5, wherein the third program and verification step comprises the step of, when the program pulse is supplied more than P times (where P is a natural number greater than M), indicating a program fail and finishing the program operations.

12. The method of claim 5, wherein in the first program and verification step, the first verification operation is not performed on the memory cells programmed to have the third and fourth threshold voltage distributions.

13. The method of claim 12, wherein in the second program and verification step, the second verification operation is not performed on the memory cells programmed to have the fourth threshold voltage distribution.

14. The method of claim 13, wherein the verification operations are not performed on memory cells programmed to have a threshold voltage distribution determined to be a program pass.

15. A method of programming a nonvolatile memory device, where the nonvolatile memory device has memory cells coupled to bit lines and word lines and further has page buffers that are each coupled to one or more of the bit lines, the method comprising:
an initial data setting step of inputting data to first to third latches of a selected page buffer of the page buffers so that selected memory cells of the memory cells are programmed to each have one of first to fourth threshold voltage distributions and changing the data of the first latch so that memory cells to be programmed with the third and fourth threshold voltage distributions are program-inhibited;
a first program and verification step of performing program and verification operations in response to a state of the data of the first latch;
a second program and verification step of, when a program pulse is supplied more than N times (where N is a natural number), setting first data to change the data of the first latch so that memory cells to be programmed with the third threshold voltage distribution can be programmed and performing program and verification operations in response to a state of the data of the first latch; and
a third program and verification step of, when the program pulse is supplied more than M times (where M is a natural number greater than N), setting second data to change the data of the first latch so that memory cells to be programmed with the fourth threshold voltage distribution can be programmed and performing program and verification operations in response to a state of the data of the first latch.

16. The method of claim 15, wherein:
memory cells to be programmed with the first threshold voltage distribution are in an erase state,
a threshold voltage of the memory cells programmed to have the third threshold voltage distribution is higher than a threshold voltage of memory cells programmed to have the second threshold voltage distribution, and
a threshold voltage of the memory cells programmed to have the fourth threshold voltage distribution is higher than a threshold voltage of the memory cells programmed to have the third threshold voltage distribution.

17. The method of claim 16, wherein the initial data setting step comprises:
inputting the data to be programmed to the first latch and inputting data to the second and third latches according to specific threshold voltage distributions of the data to be programmed from the first to fourth threshold voltage distributions; and
changing a state of the data of the first latch in response to states of the data of the second and third latches.

18. The method of claim 17, wherein the step of changing a state of the data of the first latch in response to states of the data of the second and third latches comprises the steps of:
precharging a sense node of the page buffer;
discharging the sense node in response to a data state of a first node of the second latch, discharging the sense node in response to a data state of a first node of the third latch, and then changing the data of the first latch in response to a voltage level of the sense node; and
discharging the sense node in response to a data state of a second node of the second latch, discharging the sense node in response to the data state of the first node of the third latch, and then changing the data of the first latch in response to a voltage level of the sense node.

19. The method of claim 18, wherein the first data setting step comprises the steps of:
   precharging the sense node; and
   discharging the sense node in response to a data state of the first node of the second latch, discharging the sense node in response to the data state of the first node of the third latch, and then changing the data of the first latch in response to a voltage level of the sense node.

20. The method of claim 18, wherein the second data setting step comprises the steps of:
   precharging the sense node; and
   discharging the sense node in response to a data state of the second node of the second latch, discharging the sense node in response to the data state of the first node of the third latch, and then changing the data of the first latch in response to a voltage level of the sense node.

21. The method of claim 15, wherein the third program and verification step comprises the step of, when the program pulse is supplied more than P times (where P is a natural number greater than M), indicating program state information as a program fail and finishing the program operations.

22. The method of claim 15, wherein in the first program and verification step, the first verification operation is not performed on the memory cells programmed to have the third and fourth threshold voltage distributions.

23. The method of claim 22, wherein in the second program and verification step, the second verification operation is not performed on the memory cells programmed to have the fourth threshold voltage distribution.

24. The method of claim 23, wherein the verification operations are not performed on memory cells programmed to have a threshold voltage distribution determined to be a program pass.

25. A method of programming a nonvolatile memory device, where erase cells are programmed to each have one of N threshold voltage distributions and N is a natural number, the method comprising the step of:
   setting a different program pulse for performing a program operation for every group of the memory cells to be programmed with the threshold voltage distributions, program-inhibiting the memory cells before a certain number of the program pulses are supplied, and performing the program operation when the certain number of program pulses is reached,
   wherein a greater number of the program pulses are set for memory cells to be programmed with a higher threshold voltage distribution than a threshold voltage distribution used for the performed program operation.

* * * * *